(12) United States Patent
Wang et al.

(10) Patent No.: US 10,338,136 B2
(45) Date of Patent: Jul. 2, 2019

(54) INTEGRATED CIRCUIT WITH LOW POWER SCAN SYSTEM

(71) Applicant: NXP USA, INC., Austin, TX (US)

(72) Inventors: Ling Wang, Suzhou (CN); Wanggen Zhang, Suzhou (CN); Wei Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 332 days.

(21) Appl. No.: 15/365,890

(22) Filed: Nov. 30, 2016

(65) Prior Publication Data
US 2018/0059178 A1    Mar. 1, 2018

(30) Foreign Application Priority Data

Aug. 29, 2016 (CN) .......................... 2016 1 0754723

(51) Int. Cl.
| | | |
|---|---|---|
| *G01R 31/3177* | (2006.01) | |
| *G01R 31/317* | (2006.01) | |
| *G01R 31/3185* | (2006.01) | |
| *G01R 31/34* | (2006.01) | |

(52) U.S. Cl.
CPC ... *G01R 31/3177* (2013.01); *G01R 31/31723* (2013.01); *G01R 31/31725* (2013.01); *G01R 31/318541* (2013.01); *G01R 31/318575* (2013.01)

(58) Field of Classification Search
CPC .......... G01R 31/3177; G01R 31/31723; G01R 31/31725; G01R 31/318541; G01R 31/318575
See application file for complete search history.

(56) References Cited

U.S. PATENT DOCUMENTS

| | | | |
|---|---|---|---|
| 6,519,729 B1 | 2/2003 | Whetsel | |
| 6,769,080 B2 | 6/2004 | Whetsel | |
| 7,406,639 B2 | 7/2008 | Clark | |
| 7,493,538 B2 | 2/2009 | Whetsel | |
| 7,779,320 B2 | 8/2010 | Chmelar | |
| 7,797,603 B2 | 9/2010 | Rajski | |
| 7,843,218 B1* | 11/2010 | Ramaraju | G01R 31/318541 326/38 |
| 7,925,465 B2 | 4/2011 | Lin | |
| 8,332,698 B2* | 12/2012 | Tang | G01R 31/318594 714/726 |
| 8,566,658 B2 | 10/2013 | Tekumalla | |

(Continued)

FOREIGN PATENT DOCUMENTS

WO    2013016989    2/2013

*Primary Examiner* — April Y Blair
*Assistant Examiner* — Dipakkumar B Gandhi
(74) *Attorney, Agent, or Firm* — Charles E. Bergere

(57) ABSTRACT

An integrated circuit operable in a scan mode includes a scan chain formed by cascaded flip-flop cells. Each flip-flop cell includes a master latch that receives a first data signal and generates a first latch signal, a slave latch that receives the first latch signal and generates a second latch signal, and a multiplexer having first and second inputs respectively connected to the master and slave latches that receives a first input signal and the second latch signal, and generates a scan data output signal depending on an input trigger signal. The first input signal is one of the first data signal and the first latch signal. The clock signal provided to the slave latch is gated by the input trigger signal.

17 Claims, 11 Drawing Sheets

(56) References Cited

U.S. PATENT DOCUMENTS

| | | |
|---|---|---|
| 8,627,160 B2 | 1/2014 | Devta-Prasanna |
| 9,964,596 B2 * | 5/2018 | Wang ............. G01R 31/318541 |
| 2002/0035712 A1 | 3/2002 | Whetsel |
| 2003/0204801 A1 * | 10/2003 | Tkacik ............. G01R 31/31719 |
| | | 714/726 |
| 2008/0320351 A1 | 12/2008 | Whetsel et al. |
| 2011/0004434 A1 | 1/2011 | Whetsel |
| 2012/0209556 A1 | 8/2012 | Rajski |
| 2014/0040688 A1 | 2/2014 | Zhang |

* cited by examiner

US 10,338,136 B2

INTEGRATED CIRCUIT WITH LOW POWER SCAN SYSTEM

BACKGROUND

The present invention relates to testing integrated circuits (ICs) and, more particularly, to testing an integrated circuit with a low power scan system.

Scan chains are widely used in integrated circuits (IC) to obtain access to internal nodes of an IC to simplify testing of the IC by passing test data through flip-flops of the IC. FIG. 1 is a schematic block diagram of a conventional scan system 100 including a plurality of scan chains 102 arranged in parallel to each other. Each scan chain 102 is formed by a plurality of cascaded flip-flop cells 104.

FIG. 2 is a schematic block diagram of one of the flip-flop cells 104 of FIG. 1. The flip-flop cell 104 includes a master latch 106, a slave latch 108 having an input terminal connected to an output terminal of the master latch 106, and a multiplexer 110 having an output terminal connected to an input terminal of the master latch 106. The flip-flop cell 104 is configured to operate in one of two modes, functional mode and scan mode. The multiplexer receives a data input signal (D) and a scan data input signal (SDI), and generates a first data signal depending on a scan enable signal, which is active in the scan mode. A clock signal is provided to both the master and slave latches.

For a full scan design, during scan testing, all of the flip-flop cells 104 in the IC and all of the combinational logic cells connected to the flip-flop cells 104, may be toggling at the same time, causing very high power consumption. This high power consumption is much greater than the power consumption in normal functional mode where only some of the combinational logic and flip-flops are toggling, and such high power consumption may exceed the IC's power rating. Further, as IC chip density and speed increase, the scan shift power problem is exacerbated. Therefore, there is a need for providing a low power scan system.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
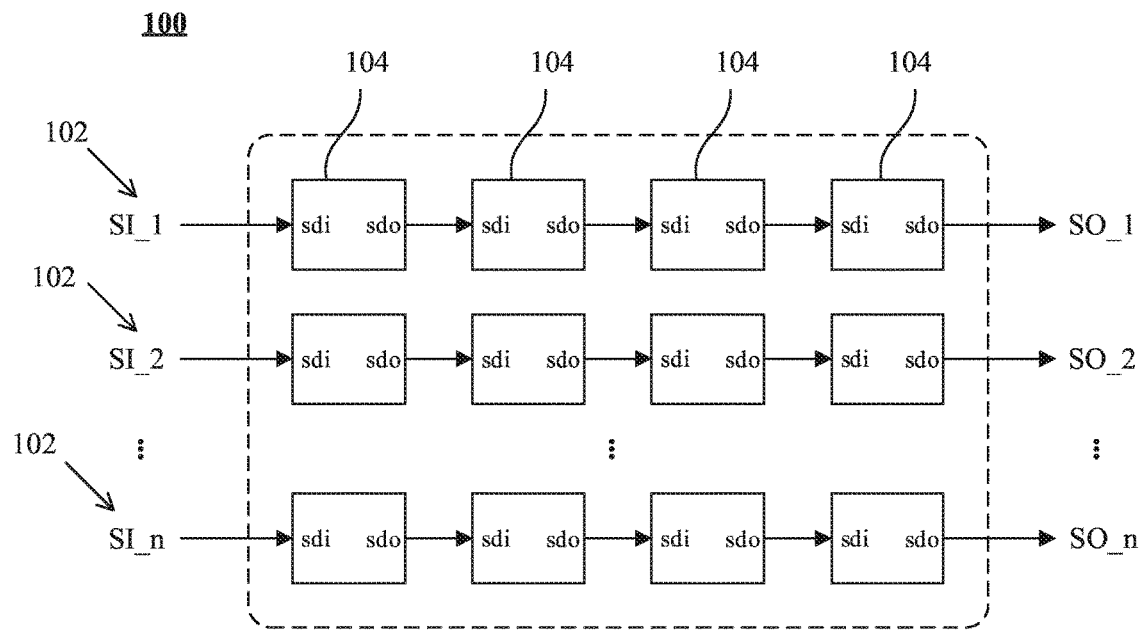
FIG. 1 is a schematic block diagram of a conventional scan test system formed by a plurality of conventional flip-flop cells.
Figure 2:
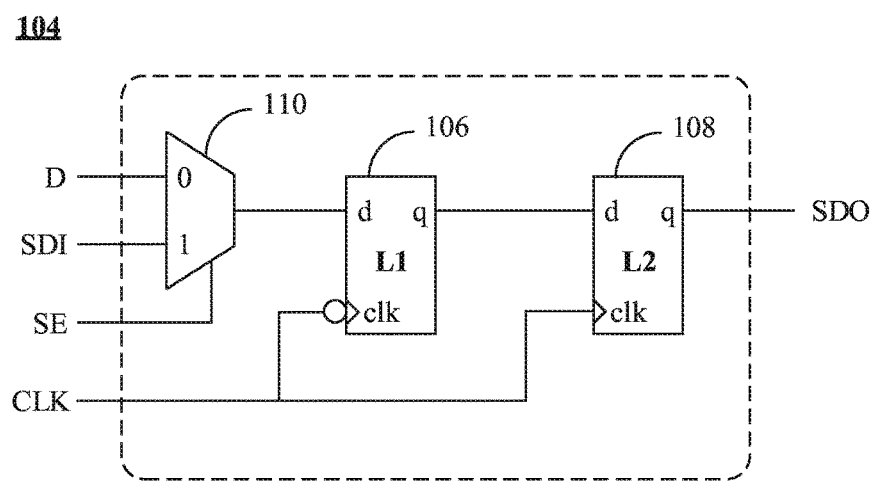
FIG. 2 is a schematic block diagram of a conventional flip-flop cell of FIG. 1.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an IC operable in a scan mode is provided. The IC includes at least one scan chain formed by a plurality of cascaded flip-flop cells, where the scan chain receives a scan input signal (SI), and outputs a scan output signal (SO). Each flip-flop cell includes a master latch that receives a first data signal and generates a first latch signal based on a clock signal, a slave latch, connected to the master latch, that receives the first latch signal and generates a second latch signal based on the clock signal, and a first multiplexer having first and second input terminals respectively connected to the master and slave latches that receives a first input signal and the second latch signal, and generates a scan data output signal (SDO) depending on an input trigger signal. The first input signal is one of the first data signal and the first latch signal. The flip-flop cell further includes a first logic gate that gates the clock signal provided to the slave latch with the input trigger signal, and at least one second logic gate that receives the input trigger signal and generates an output trigger signal as the input trigger signal of a next flip-flop cell in the at least one scan chain. The flip-flop cells include at least a first flip-flop cell that receives the scan input signal, and a last flip-flop cell that outputs its scan data output signal as the scan output signal.

In another embodiment, the present invention provides a method for performing a scan test on an IC, operable in a scan mode, that includes at least one scan chain formed by a plurality of cascaded flip-flop cells. The plurality of flip-flop cells include at least a first flip-flop cell for receiving a scan input signal, and a last flip-flop cell for outputting a scan output signal. Each flip-flop includes a master latch and a slave latch connected in series. The method includes: providing a clock signal to the plurality of flip-flop cells, providing the scan input signal to the scan chain through a scan data input terminal of the first flip-flop cell based on the clock signal, and starting from the last flip-flop cell of the scan chain, configuring every N flip-flop cells as a subset, where N is a natural number greater than 1. The method further includes selecting a selected flip-flop cell from each subset in each clock cycle of the clock signal, disabling and bypassing the slave latches of non-selected flip-flop cells in the chain, shifting the scan input signal to the selected flip-flop cell in each subset, and outputting data in the slave latch of the selected flip-flop cell in a subset that includes the last flip-flop cell of the scan chain as the scan output signal of the scan chain. The N flip-flop cells in each subset are selected successively from the last flip-flop cell in the subset in a round-robin manner.

Figure 3:
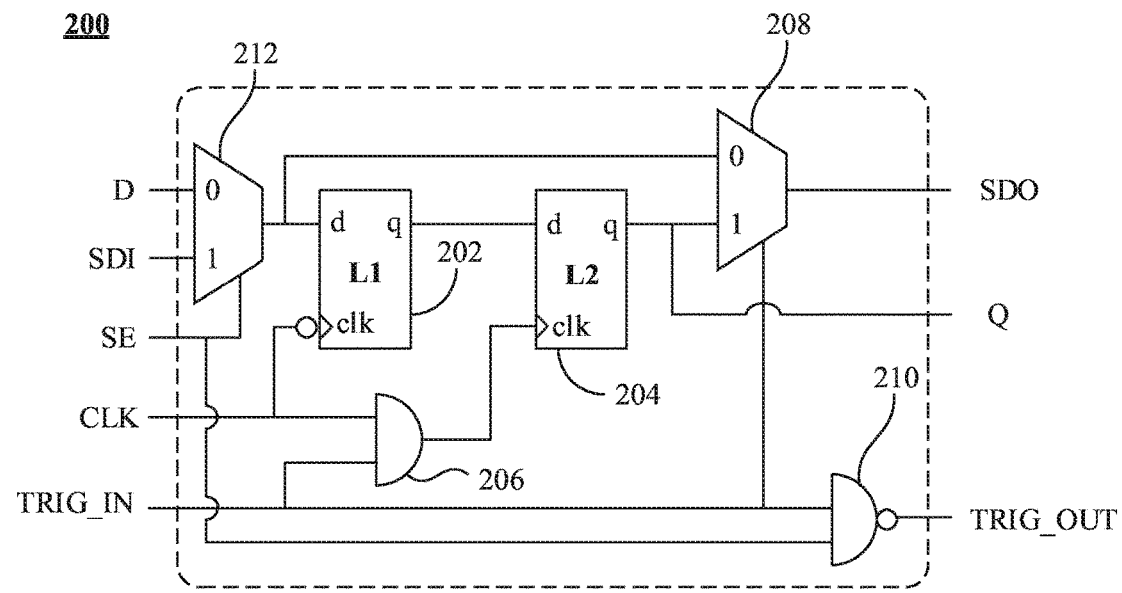
FIG. 3 is a schematic block diagram of a flip-flop cell in accordance with a first embodiment of the present invention.

Referring now to FIG. 3, a schematic block diagram of a proposed flip-flop cell 200 operable in a scan mode in accordance with an embodiment of the present invention is shown. The flip-flop cell 200 includes a master latch 202 and a slave latch 204. The master latch 202 receives a first data signal at a data input terminal and a clock signal (CLK) at a clock input terminal, and generates a first latch signal at an output terminal based on a clock signal. The slave latch 204 has a data input terminal connected to the output terminal of the master latch 202. The slave latch 204 receives the first latch signal at the data input terminal and the clock signal at a clock input terminal, and generates a second latch signal at an output terminal based on the clock signal, where the clock signal provided to the slave latch 204 is gated with an input trigger signal (TRIG_IN) by a first logic gate 206. In a preferred embodiment, the first logic gate 206 is an AND gate. In this manner, the trigger signal is used to prevent unwanted power dissipation of the flip-flop cell 200. In a preferred embodiment, the master latch 202 receives the first data signal and generates the first latch signal in a second half of each clock cycle, and the slave latch 204 receives the first latch signal and generates the second latch signal in a first half of a next clock cycle.

The flip-flop cell 200 also includes a first multiplexer 208 having a first input terminal connected to the data input terminal of the master latch 202 for receiving the first data signal, and a second input terminal connected to the output terminal of the slave latch 204 for receiving the second latch signal. The first multiplexer 208 generates a scan data output signal (SDO) depending on the input trigger signal, such that both the master and slave latches 202 and 204 are bypassed depending on the trigger signal. The flip-flop cell 200 further includes at least one second logic gate 210 that receives the input trigger signal and generates an output trigger signal as the input trigger signal of a next flip-flop cell in the at least one scan chain.

In a preferred embodiment, the flip-flop cell 200 is operable in a functional mode and the scan mode. The flip-flop cell 200 includes a second multiplexer 212 having first and second input terminals that respectively receive a data input signal (D) and a scan data input signal (SDI), and an output terminal connected to the data input terminal of the master latch 202. In the scan mode, the second multiplexer 212 generates the first data signal based on a scan enable signal (SE). In a preferred embodiment, the at least one second logic gate 210 is a NAND gate that gates the input trigger signal with the scan enable signal and outputs the output trigger signal.

Figure 4:
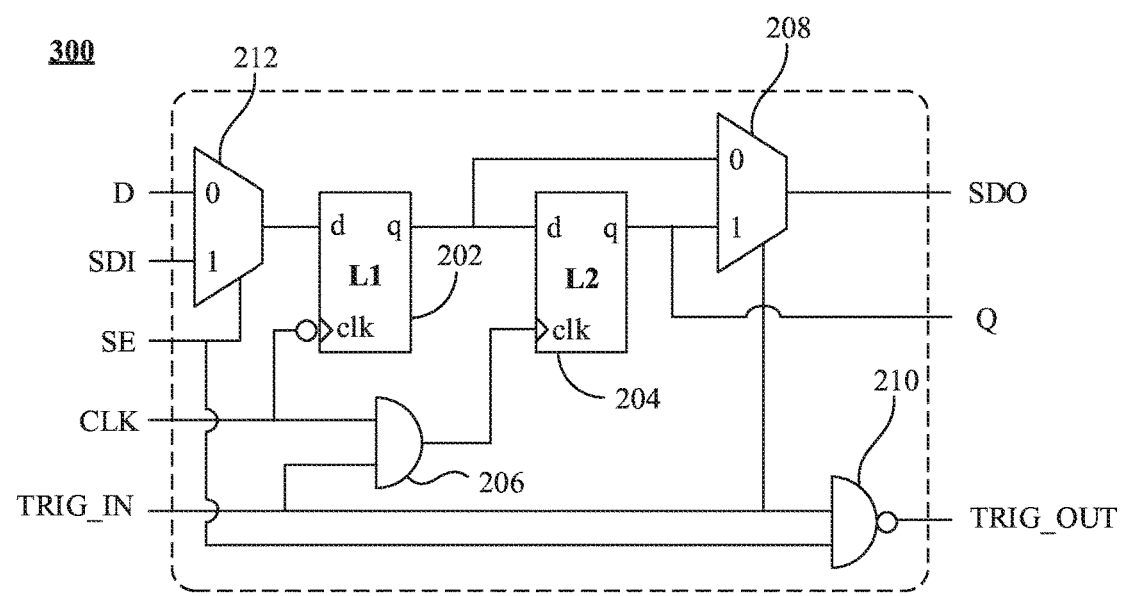
FIG. 4 is a schematic block diagram of a flip-flop cell in accordance with a second embodiment of the present invention.

FIG. 4 is a schematic block diagram of a flip-flop cell 300, operable in the scan mode, in accordance with a second embodiment of the present invention. The flip-flop cell 300 is substantially the same as the flip-flop cell 200 shown in FIG. 3 except that the first input terminal of the first multiplexer 208 is connected to the output terminal of the master latch 202 for receiving the first latch signal, such that the slave latch 204 is bypassed based on the input trigger signal.

Figure 5:
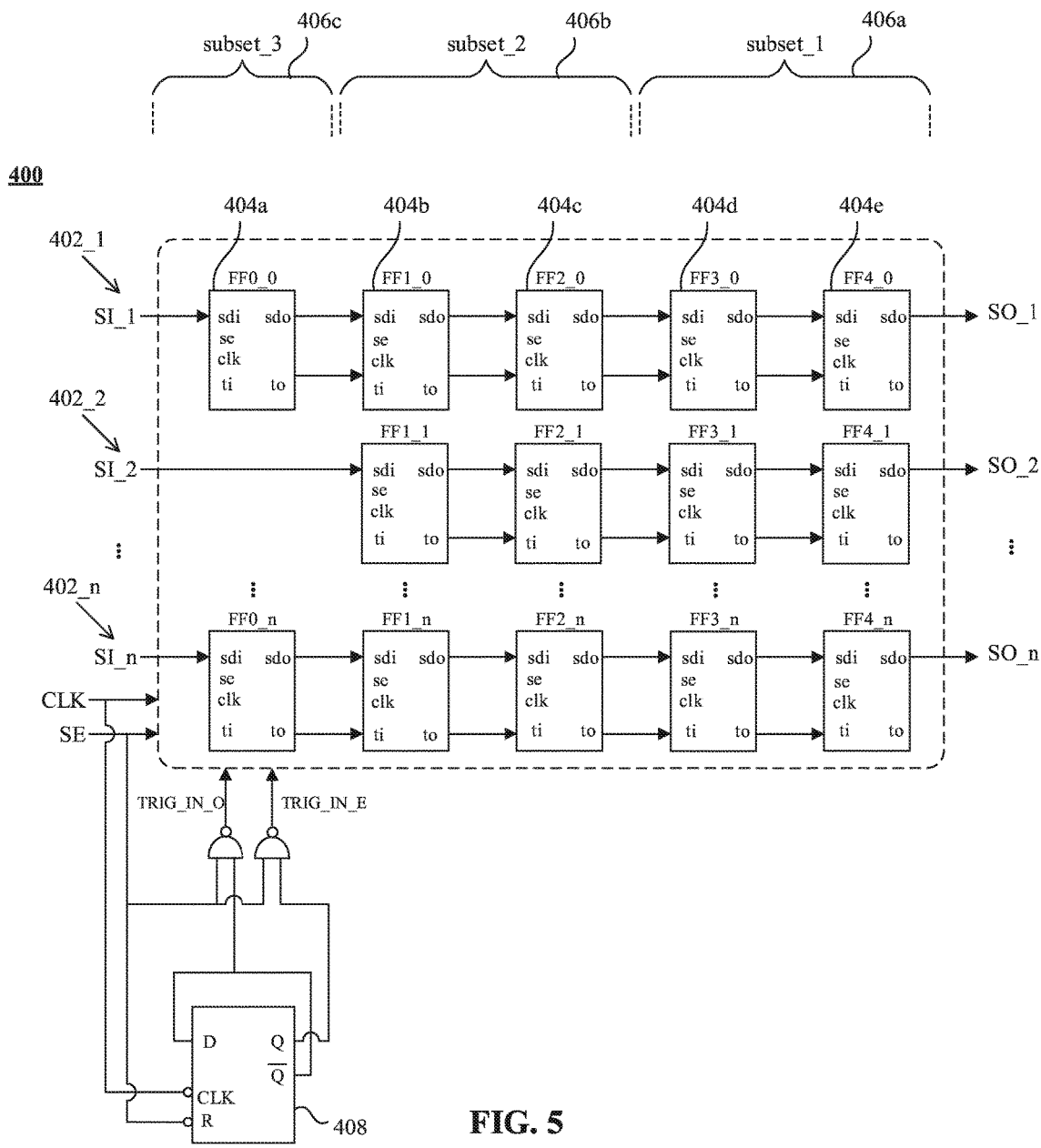
FIG. 5 is a schematic block diagram of an IC having a low power scan test system formed by a plurality of flip-flop cells of FIG. 3 or FIG. 4 in accordance with an embodiment of the present invention.

FIG. 5 is a schematic block diagram of an IC 400 with a low power scan test system formed by n scan chains 402_1~402_n, where n is a natural number, in accordance with an embodiment of the present invention. Each of the n scan chains 402_1~402_n receives a corresponding scan input signal (SI_i) at a corresponding scan input terminal of the scan chain, and output a corresponding scan output signal (SO_i) at a corresponding scan output terminal of the scan chain, where i is a natural number, and 1≤i≤n, and each scan chain includes at least two cascaded flip-flop cells. The cascaded flip-flop cells in each scan chain include at least a first flip-flop cell that receives the scan input signal (SI_i), and a last flip-flop cell that outputs the scan output signal (SO_i). In a preferred embodiment, the flip-flop cells in FIG. 5 are the flip-flop cell 200 shown in FIG. 3. In another preferred embodiment, the flip-flop cells in FIG. 5 are the flip-flop cell 300 shown in FIG. 4.

In a preferred embodiment, the scan chains in the IC 400 have different number of flip-flop cells. In the example shown in FIG. 5, the scan chain 402_1 is formed by five flip-flop cells 404a~404e, where the flip-flop cell (FF0_0) 404a is the first flip-flop cell of the scan chain 402_1 that receives the scan input signal (SI_1), and the flip-flop cell (FF4_0) 404e is the last flip-flop cell of the scan chain 402_1 that outputs the scan output signal (SO_1), while the scan chain 402_2 is formed by four flip-flop cells, where the flip-flop cell (FF1_1) is the first flip-flop cell of the scan chain 402_2 that receives the scan input signal (SI_2), and the flip-flop cell (FF4_1) is the last flip-flop cell of the scan chain 402_2 that outputs the scan output signal (SO_2).

In a preferred embodiment, starting from the last flip-flop cell of each scan chain, every N flip-flop cells of the plurality of flip-flop cells are configured as a subset, wherein N is a natural number greater than 1, and less than or equal to the number of the flip-flop cells in the scan chain. In the example shown in FIG. 5, N is 2. That is, in the scan chain 402_1, the flip-flop cells 404e and 404d form a first subset 406a, the flip-flop cells 404c and 404b form a second subset 406b, and the flip-flop cell 404a forms a third subset 406c, which is also a last subset in the scan chain 402_1, and in the scan chain 402_2, there are only two subsets, each has two flip-flop cells. The number of the flip-flop cells in the last subset can be equal to or less than N. In the scan mode, the input trigger signal of each of the N flip-flop cells in each subset is asserted successively from a last flip-flop cell of each subset in every N clock cycles. When N is 2, the input trigger signal to the flip-flop cell 404a in the third subset 406c is asserted in a first clock cycle of every two clock cycles and de-asserted in a second clock cycle of the every two clock cycles. In a preferred embodiment, when N is 2, the input trigger signal of one of the flip-flop cells in each subset is a one-bit signal and is inverted to the input trigger signal of the other one of the flip-flop cell in the subset.

The IC 400 further includes a trigger signal generator 408 that generates at least the input trigger signal of the first flip-flop cell 404a in the scan chain 402_1. In a preferred embodiment, in the scan mode, the input trigger signal toggles at a falling edge of each clock cycle. In a preferred embodiment, when N is 2, the trigger signal generator 408 is a flip-flop providing a first input trigger signal (TRIG_IN_O) for scan chains that have odd number of flip-flop cells, and a second input trigger signal (TRIG_IN_E) for scan chains that have even number of flip-flop cells, such that in the scan mode, the input trigger signal to the last flip-flop cell of each scan chain is asserted at a first clock cycle once the scan enable signal is active.

Figure 6A:
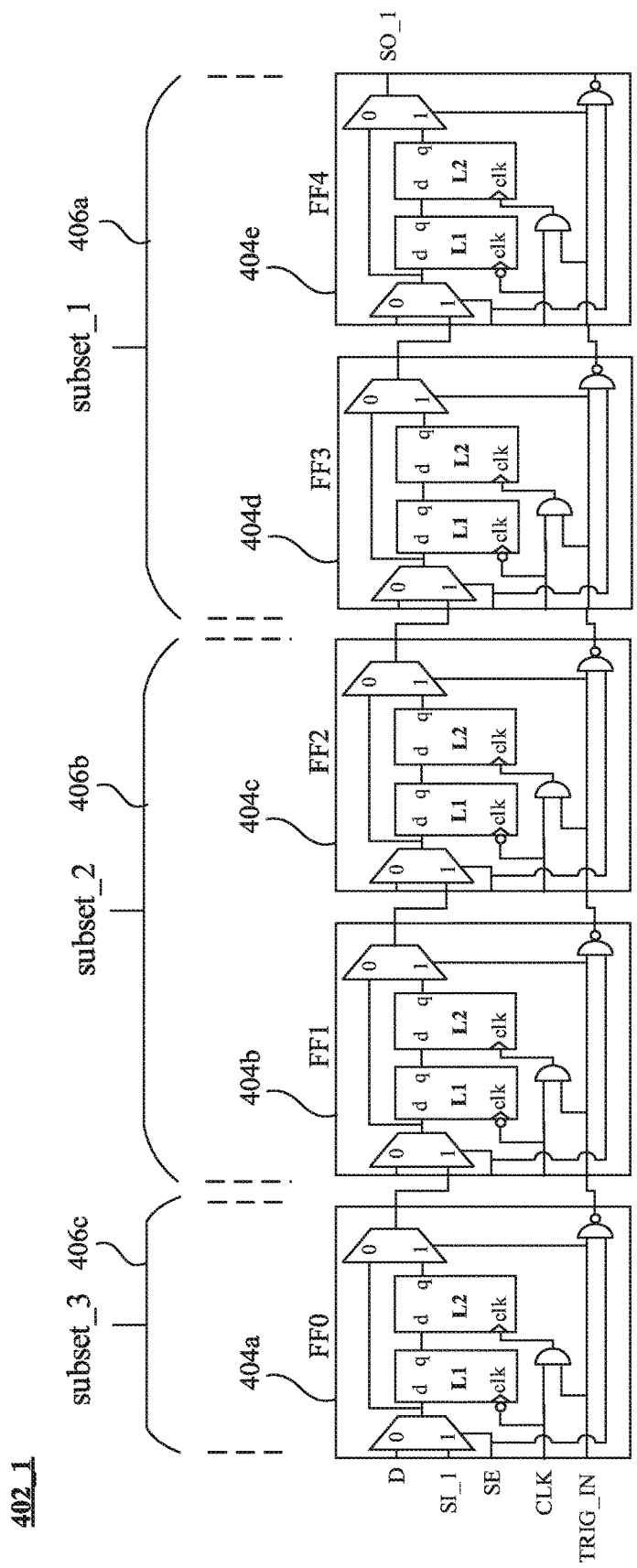
FIGS. 6A-6C are various schematic block diagrams of a scan chain of the IC of FIG. 5 formed by a plurality of the flip-flop cells of FIG. 3 in accordance with an embodiment of the present invention.

FIG. 6A is a schematic block diagram of the scan chain 402_1 of FIG. 5 formed by the flip-flop cells 404a~404e that each has a structure of the flip-flop cell 200 of FIG. 3 in accordance with an embodiment of the present invention. The scan data input terminal of the first flip-flop cell 404a receives the scan input signal SI_1 of the scan chain 402_1, and the scan data output terminal of the last flip-flop cell 404e outputs the scan output signal SO_1 of the scan chain 402_1. Each of the flip-flop cells 404a~404c has the scan data output terminal connected to the scan data input terminal of a next flip-flop cell. Each of the flip-flop cells 404b~404e receives an output trigger signal from a previous flip-flop cell respectively thereof as its input trigger signal.

Figure 6B:
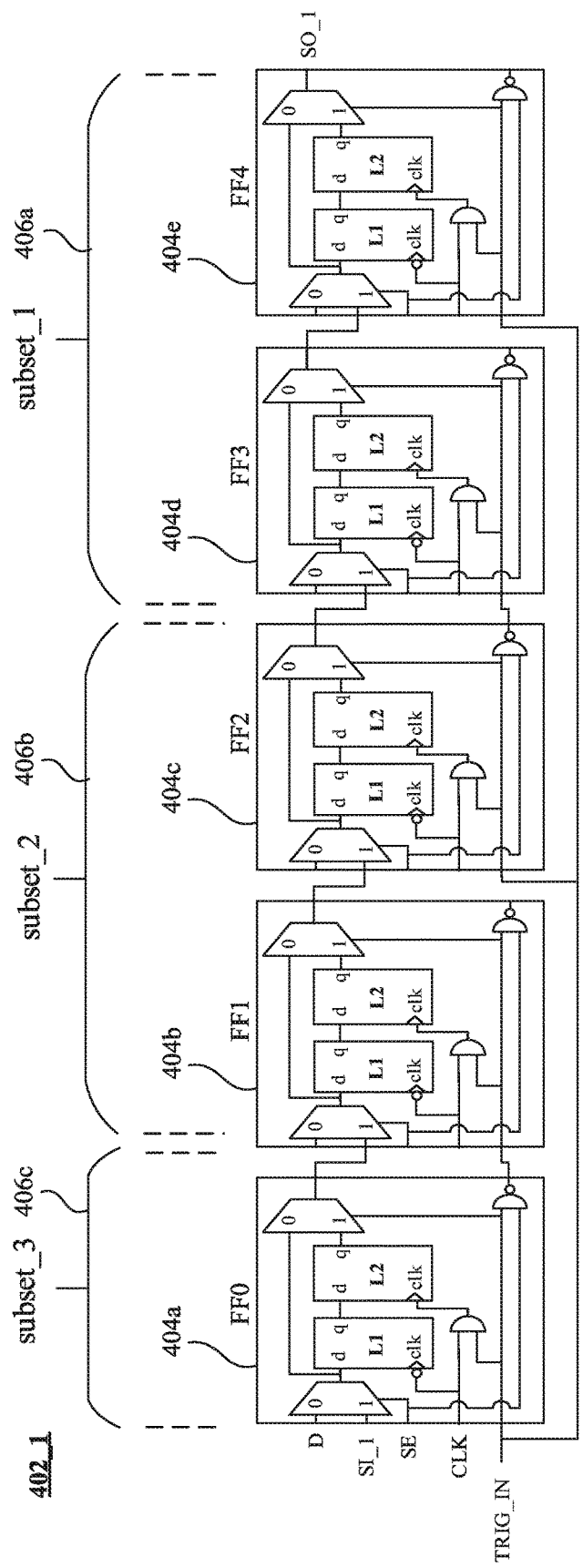
Figure 6C:
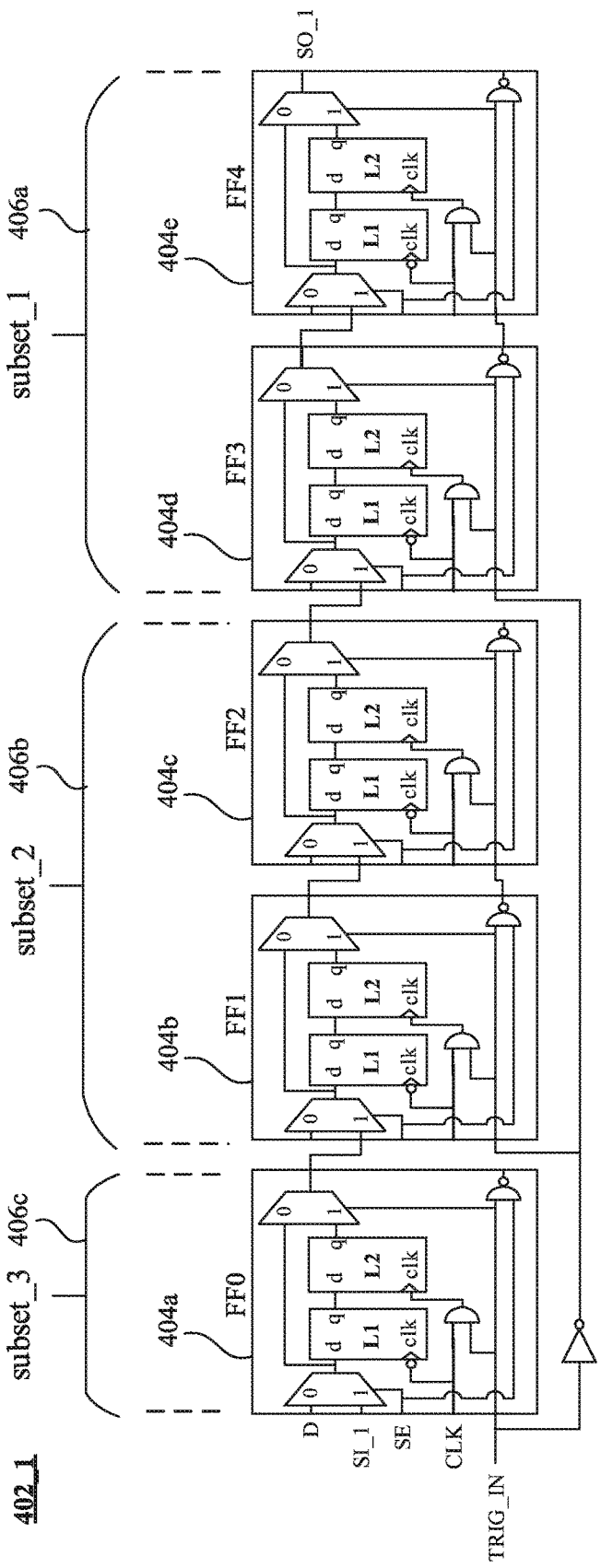

FIGS. 6B and 6C are respectively schematic block diagrams of the scan chain 402_1 of FIG. 5 using the flip-flop cells 404a~404e that each has a structure of the flip-flop cell 200 of FIG. 3 in accordance with second and third embodiments of the present invention.

In FIG. 6B, the scan chain 402_1 is substantially the same as the scan chain 402_1 shown in FIG. 6A except that the input trigger signal of the scan chain 402_1 is provided directly to odd flip-flop cells 404a, 404c and 404e, and each of the even flip-flop cells 404b and 404d receives an inverted input trigger signal from a previous flip-flop cell respectively thereof. Similarly, in FIG. 6C, the scan chain 402_1 is substantially the same as the scan chain 402_1 shown in FIG. 6A except that the input trigger signal of the scan chain 402_1 is provided to the first flip-flop cell 404a, and an inverted input trigger signal is directly provided to the even flip-flops 404b and 404d. The non-first odd flip-flops 404c and 404e receives the input trigger signal from a previous flip-flop cell respectively thereof.

Figure 7A:
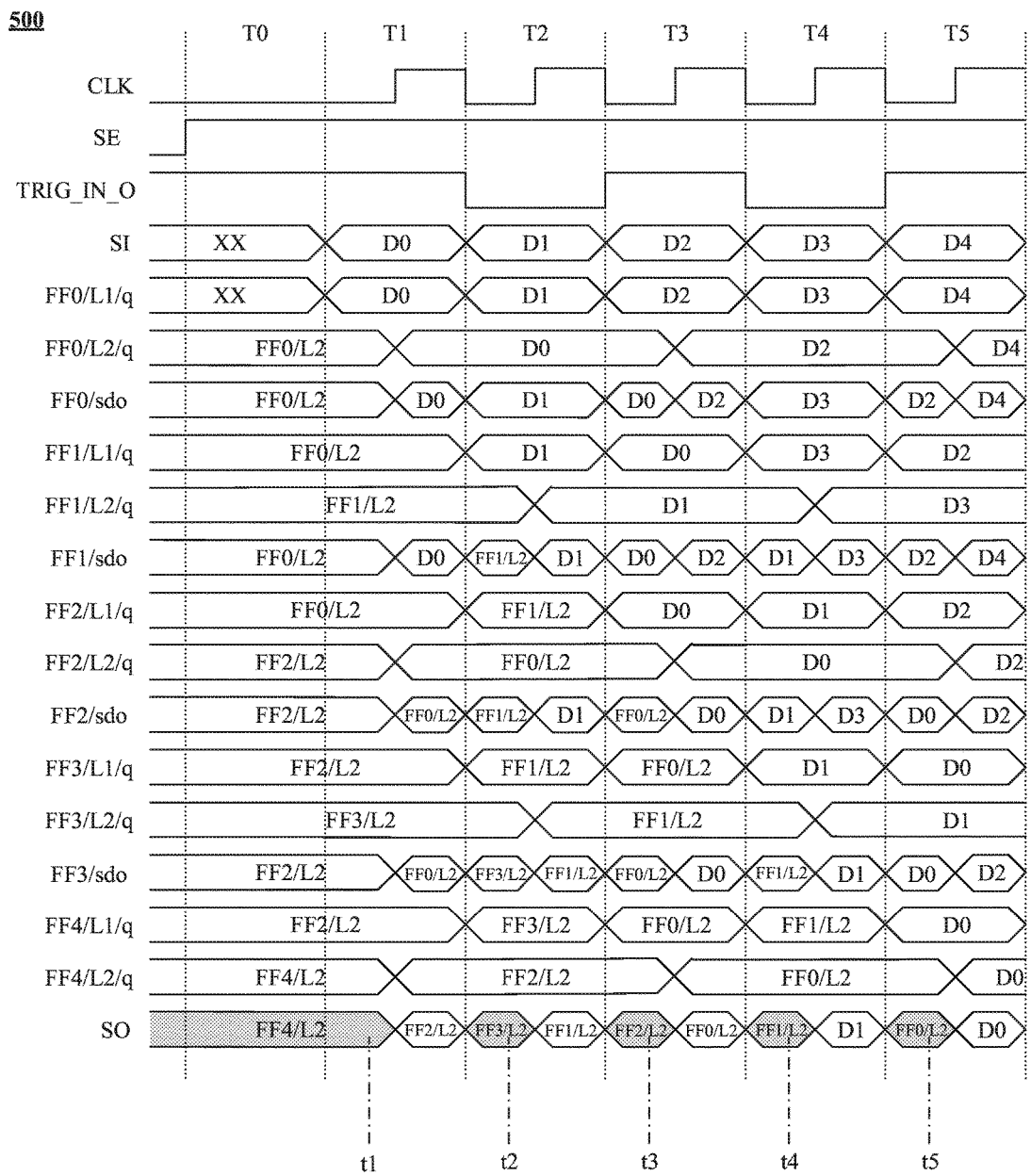
FIG. 7A is a timing diagram illustrating the cycles that are exercised during scan mode of a first scan chain of the IC of FIG. 5 in accordance with an embodiment of the present invention.
Figure 7B:
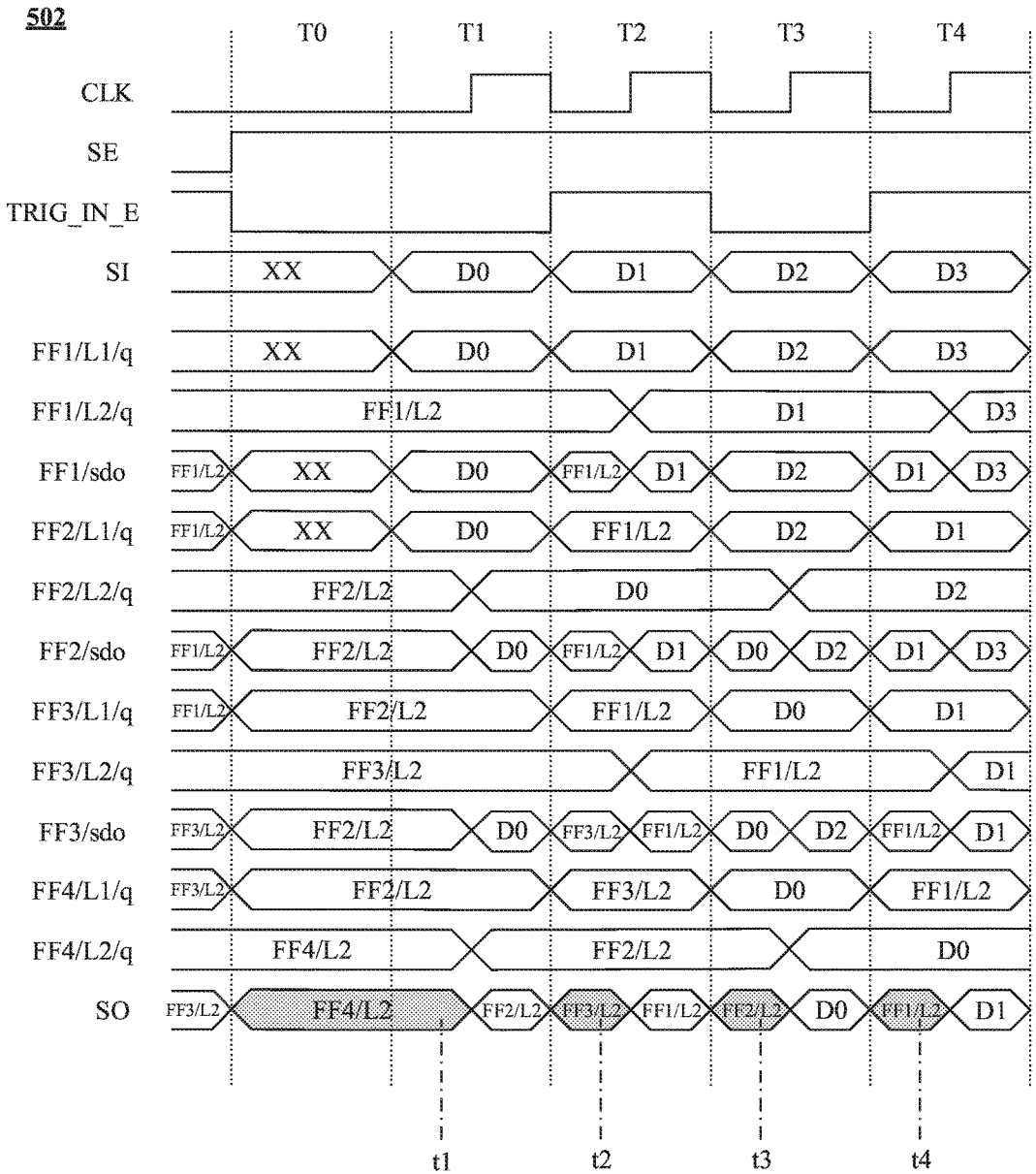
FIG. 7B is a timing diagram illustrating the cycles that are exercised during scan mode of a second scan chain of the IC of FIG. 5 in accordance with an embodiment of the present invention.

FIG. 7A is a timing diagram 500 illustrating the cycles that are exercised during the scan mode of the scan chain 402_1 of FIG. 6A that has odd number of flip-flop cells in accordance with an embodiment of the present invention. The integrated circuit 400 is configured in the scan mode by asserting the scan enable signal. In the example shown in FIG. 7A, starting from the last flip-flop cell of the scan chain, every 2 flip-flop cells of the plurality of flip-flop cells are configured as a subset. When N is 2 and there are an odd number of flip-flop cells in the chain, the input trigger signal (TRIG_IN_O) is a one-bit signal that is asserted starting from a leading edge of a second half of an odd clock cycle to a leading edge of a second half of a subsequent even clock cycle to selected the odd flip-flops in the chain, and de-asserted starting from a leading edge of a second half of an even clock cycle to a leading edge of a second half of a subsequent odd clock cycle to selected the odd flip-flops in the chain. When N is 2 and there are an even number of flip-flop cells in the chain, the input trigger signal (TRIG_IN_O) is a one-bit signal that is asserted starting from a leading edge of a second half of an even clock cycle to a leading edge of a second half of a subsequent odd clock cycle to selected the odd flip-flops in the chain, and de-asserted starting from a leading edge of a second half of an odd clock cycle to a leading edge of a second half of a subsequent even clock cycle to selected the odd flip-flops in the chain.

The scan input signal is provided to the scan chain 402_1 based on the clock signal. The master latch L1 of each flip-flop cell receives the first data signal and generates the first latch signal at an output q in a second half of each clock cycle, and the slave latch L2 of a selected flip-flop cell receives the first latch signal and generates the second latch signal at an output q in a first half of a next clock cycle. The slave latch of each non-selected flip-flop cell is bypassed and holds the second latch signal, such that starting from the last flip-flop cell, the scan chain 402_1 successively outputs the second latch signal of each of the flip-flop cells in the chain in a second half of a clock cycle. In this manner, unwanted power dissipation of the non-selected flip-flop cells is prevented in the scan mode.

FIG. This a timing diagram 502 illustrating the cycles that are exercised during the scan mode of the scan chain 402_2 of FIG. 5 that has even number of flip-flop cells in accordance with an embodiment of the present invention. The timing diagram 502 is substantially the same as the timing diagram shown in FIG. 7A except that when the scan enable signal (SE) is active, the input trigger signal (TRIG_IN_E) is inverted to the input trigger signal (TRIG_IN_O) in FIG. 7A, and it takes only four clock cycles to shift out the data in the second latch of the four flip-flop cells in the scan chain 402_2.

Figure 8:
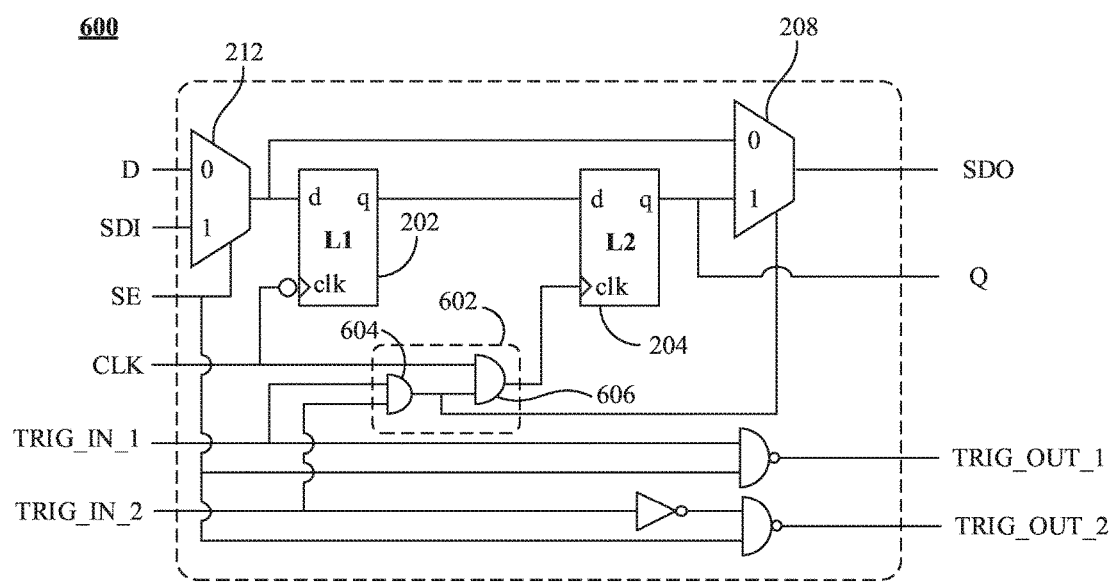
FIG. 8 is a schematic block diagram of a flip-flop cell in accordance with a third embodiment of the present invention.

Referring to FIG. 8, a schematic block diagram of a proposed flip-flop cell 600 operable in a scan mode in accordance with a third embodiment of the present invention is shown. The flip-flop cell 600 is similar to the flip-flop cell 200 shown in FIG. 3 except that the clock signal provided to the slave latch 204 is gated with first and second input trigger signals (TRIG_IN_1 and TRIG_IN_2) by a first logic unit 602. In a preferred embodiment, the first logic unit 602 includes a first AND gate 604 that receives the first and second input trigger signals and outputs a combined trigger signal, and a second AND gate 606 that gates the clock signal with the combined trigger signal and provides the gated clock signal to the slave latch 204. The combined trigger signal is also provided to a selection input terminal of the first multiplexer. In this manner, the combined trigger signal is used to prevent unwanted power dissipation of the flip-flop cell 600. In a preferred embodiment, one of the first and second input trigger signals is inverted and provided to a next flip-flop cell in the chain as a second input trigger signal of the next flip-flop cell, and the other one of the first and second input trigger signals is provided to the next flip-flop cell as a first input trigger signal of the next flip-flop cell.

Figure 9:
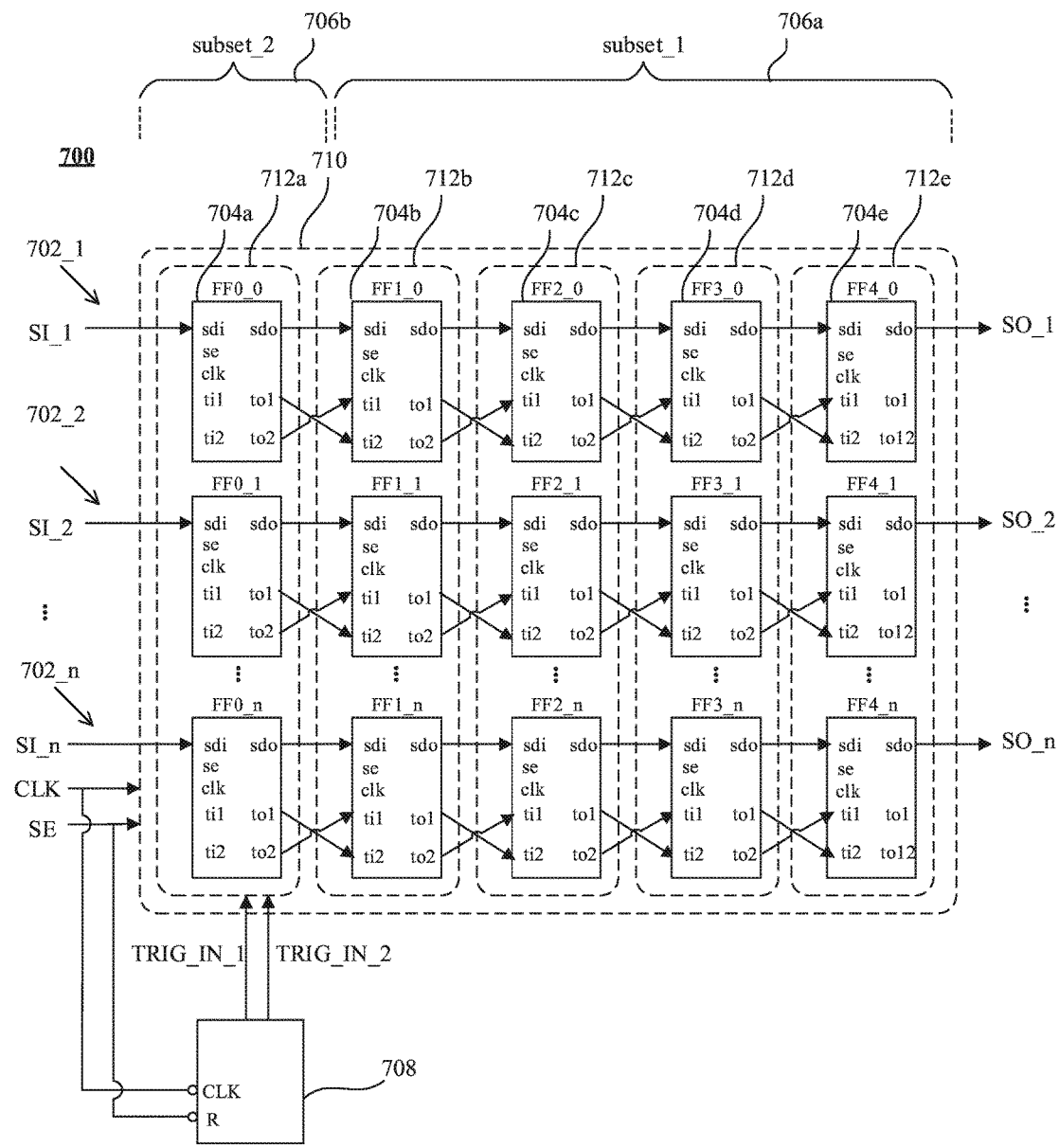
FIG. 9 is a schematic block diagram of an IC having a low power scan test system formed by a plurality of flip-flop cells of FIG. 8 in accordance with an embodiment of the present invention.

FIG. 9 is a schematic block diagram of an IC 700 with a low power scan test system formed by n scan chains 702_1~702_n, where n is a natural number, in accordance with an embodiment of the present invention. Each of the n scan chains 702_1~702_n receives a corresponding scan input signal (SI_i) at a corresponding scan input terminal of the scan chain, and output a corresponding scan output signal (SO_i) at a corresponding scan output terminal of the scan chain, where i is a natural number, and 1≤i≤n, and each scan chain includes m cascaded flip-flop cells, wherein m is a natural number, and m≥4. The m cascaded flip-flop cells in each scan chain include a first flip-flop cell that receives the scan input signal (SI_i), and a last flip-flop cell that outputs the scan output signal (SO_i).

In the example shown in FIG. 9, the scan chain 702_1 is formed by five flip-flop cells 704a~704e, where the flip-flop cell 704a is the first flip-flop cell of the scan chain 702_1 that receives the scan input signal (SI_1), and the flip-flop cell 704e is the last flip-flop cell of the scan chain 702_1 that outputs the scan output signal (SO_1). In a preferred embodiment, the flip-flop cells in FIG. 9 are the flip-flop cell 600 shown in FIG. 8.

In a preferred embodiment, starting from the last flip-flop cell 704e of the scan chain 702_1, every N flip-flop cells of the plurality of flip-flop cells are configured as a subset, wherein N is a natural number greater than 1, and less than or equal to the number of the flip-flop cells in the scan chain 702_1. In the example shown in FIG. 9, N is 4. That is, the flip-flop cells 704b~704e form a first subset 706a, and the flip-flop cell 704a forms a second subset 706b, which is also a last subset in the scan chain 702_1, wherein the number of the flip-flop cells in the last subset can be equal to or less than N. In the scan mode, the N flip-flop cells in each subset is selected successively from a last flip-flop cell of each subset in every N clock cycles. When N is 4, the flip-flop cell 704a in the second subset 706b is selected in a first clock cycle of every four clock cycles and de-asserted in the rest clock cycles of the every four clock cycles.

In a preferred embodiment, when N is 4, the first and second input trigger signals form a two-bit trigger signal. The IC 700 further includes a trigger signal generator 708 that generates the first and second trigger signals of the first flip-flop cell 704a in the scan chain 702_1. In a preferred embodiment, the trigger signal generator 708 is a Gray code generator that generates a two-bit Gray code at a falling edge of each clock cycle. In a preferred embodiment, a first input trigger signal provided to each flip-flop cell in the scan chain 702_1 is inverted and provided to a next flip-flop cell as a second input trigger signal thereof, and a second input trigger signal provided to each flip-flop cell in the scan chain 702_1 is provided to the next flip-flop cell as a first input trigger signal thereof, such that the four flip-flop cells in each subset are successively selected from a last flip-flop cell in every four clock cycles.

In a preferred embodiment, the n scan chains 702_1~702_n form an array 710 of the flip-flop cells. The array includes m columns of flip-flop cells including a first column formed by the first flip-flop cells of each of the n scan chains, and a last column formed by the last flip-flop cells of each of the n scan chains. In the example shown in FIG. 9, the array 710 of the flip-flop cells is formed by five columns 712a~712e of the flip-flop cells, where the column 712a is the first column and the column 712e is the last column. The flip-flop cells of the first column 712a share common first and second input trigger signals provided by the trigger signal generator 708.

Figure 10:
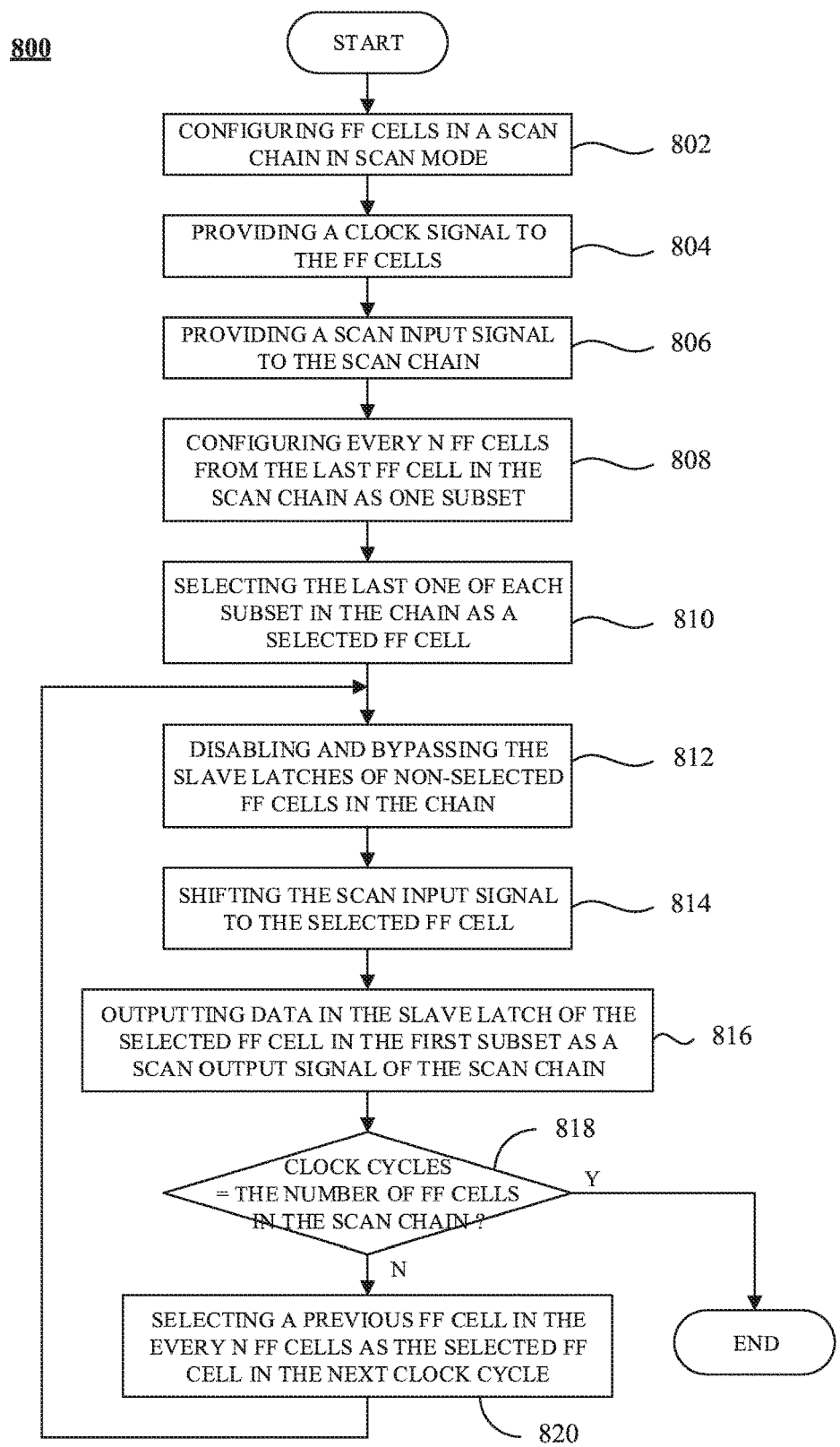
FIG. 10 is a flow chart of a low power scan method in accordance with one embodiment of the present invention.

Referring to FIG. 10, a flow chart 800 of a scan method performed on the IC 400 of FIG. 5 that includes at least one scan chain formed by a plurality of flip-flop cells in accordance with one embodiment of the present invention is shown. The at least one scan chain receives a scan input signal at a scan input terminal, and output a scan output signal at a scan output terminal. The plurality of flip-flop cells include at least a first flip-flop cell that receives the scan input signal, and a last flip-flop cell that outputs the scan output signal.

Starting at step 802, the flip-flop cells are configured in the scan mode by activating the scan enable signal. In a preferred embodiment, activating the scan enable signal includes setting the scan enable signal to logic high.

At step 804, the clock signal is provided to the flip-flop cells. In a preferred embodiment, step 804 can be performed before, after, or at the same time as step 802.

At step 806, the scan input signal is provided to the scan chain through the scan data input terminal of the first flip-flop cell based on the clock signal.

At step 808, starting from a last flip-flop cell in the scan chain, every N flip-flop cells are configured as a subset, wherein N is a natural number greater than 1, and less than or equal to the number of the flip-flop cells in the scan chain. The scan chain includes a first subset that includes the last flip-flop cell in the scan chain and a last subset that includes the first flip-flop cell in the scan chain, wherein the number of the flip-flop cells in a last subset in the scan chain that includes the first flip-flop cell can be equal to or less than N.

At step 810, at a first clock cycle, the last flip-flop cell of each subset is selected as a selected flip-flop cell by asserting the input trigger signal provided to the last flip-flop cell of each subset. The input trigger signals provided to the rest flip-flop cells in each subset that are non-selected flip-flop cells remain low. In a preferred embodiment, the input trigger signal provided to the selected flip-flop cell in each subset is asserted at a leading edge of a second half of a clock cycle, and lasts for one clock cycle.

At step 812, the slave latches of the non-selected flip-flop cells in the scan chain are disabled by gating the clock signal provided to the slave latches based on the corresponding input trigger signals provided to the non-selected flip-flop cells, which are at logic low state, and bypassed by configuring the first multiplexers of the non-selected flip-flop cells with the corresponding input trigger signals.

At step 814, the scan input signal is shifted to the selected flip-flop cell of each subset bypassing at least the slave latches of the non-selected flip-flops in each subset, and at step 816 data in the slave latch of the selected flip-flop cell in the first subset is output as the scan output signal of the scan chain bypassing at least the slave latches of the non-selected flip-flops in the first subset. In a preferred embodiment, both the master and slave latches of each of the non-selected flip-flop cells are bypassed. Each of the slave latches of the non-selected flip-flop cells in the chain holds the data previously shifted to the each of the slave latches, such that unwanted power dissipation of the non-selected flip-flop cells is prevented in the scan. In a preferred embodiment, the scan output signal is read to verify the integrated circuit.

At step 818, the number of exercised clock cycles reaches the number of the flip-flop cells in the scan chain, scan is finished, otherwise, at step 820, a flip-flop cell located right before the selected flip-flop cell in each subset is selected as the selected flip-flop cell, the rest flip-flop cells in each subset are configured as the non-selected flip-flop cells based on the input trigger signal, and then step 812 is executed again. The flip-flop cells in each subset is selected in a round-robin manner that a last flip-flop cell in the subset is selected subsequently after a first flip-flop cell in the subset.

In a preferred embodiment, the IC 400 comprises a plurality of the scan chains that form an array of the flip-flop cells. The array comprises a plurality of columns of the flip-flop cells including at least a first column formed by the first flip-flop cells of the scan chains, and a last column formed by the last flip-flop cells of the scan chains. The flip-flop cells of the first column share a common column input trigger signal provided by the trigger signal generator.

While various embodiments of the present invention have been illustrated and described, it will be clear that the present invention is not limited to these embodiments only. Moreover, although certain signals are described as either high or low active, one of skill in the art will understand that circuitry can be designed as either high or low active, so specifying a logic state in the above examples is just for explanatory purposes and is not to limit the inventive concept of the invention. Numerous modifications, changes, variations, substitutions, and equivalents will be apparent to those skilled in the art, without departing from the spirit and scope of the present invention, as described in the claims.

The invention claimed is:

1. An integrated circuit operable in a scan mode, comprising:

at least one scan chain formed by a plurality of cascaded flip-flop cells, wherein the scan chain receives a scan input signal (SI), and outputs a scan output signal (SO), and wherein each flip-flop cell comprises:
  a master latch that receives a first data signal and generates a first latch signal based on a clock signal;
  a slave latch, connected to the master latch, that receives the first latch signal and generates a second latch signal based on the clock signal;
  a first multiplexer having first and second input terminals respectively connected to the master and slave latches that receives a first input signal and the second latch signal, and generates a scan data output signal (SDO) depending on an input trigger signal, wherein the first input signal is one of the first data signal and the first latch signal;
  a first logic gate that gates the clock signal provided to the slave latch with the input trigger signal; and
  at least one second logic gate that receives the input trigger signal and generates an output trigger signal as the input trigger signal of a next flip-flop cell in the at least one scan chain, and
wherein the plurality of flip-flop cells include at least a first flip-flop cell that receives the scan input signal, and a last flip-flop cell that outputs its scan data output signal as the scan output signal, and
wherein starting from the last flip-flop cell of the at least one scan chain, every N flip-flop cells of the plurality of flip-flop cells are configured as a subset, wherein N is a natural number greater than 1, wherein in the scan mode, the input trigger signal to each of the N flip-flop cells in each subset is asserted successively from a last flip-flop cell of each subset in a round-robin manner.

2. The integrated circuit of claim 1, wherein the integrated circuit also is operable in a functional mode, and wherein each flip-flop cell further comprises:
  a second multiplexer, connected to the master latch, that receives a data input signal (D) and a scan data input signal (SDI), and generates the first data signal based on a scan enable signal.

3. The integrated circuit of claim 1, wherein when N is 2, the input trigger signal of one of the flip-flop cells in the subset is a one-bit signal and is inverted to the input trigger signal of the other one of the flip-flop cell in the subset.

4. The integrated circuit of claim 1, wherein when N is 4, the input trigger signal is a two-bit signal including first and second bits, wherein the first bit of the input trigger signal of each flip-flop cell is inverted and provided as the second bit of the input trigger signal of a next flip-flop cell, and the second bit of the input trigger signal of each flip-flop cell is provided as the first bit of the input trigger signal of the next flip-flop cell.

5. The integrated circuit of claim 1, further comprising a trigger signal generator that generates the input trigger signal of the first flip-flop cell in the at least one scan chain.

6. The integrated circuit of claim 5, wherein the at least one scan chain comprises a plurality of scan chains, wherein when N is 2, the trigger signal generator generates a first input trigger signal for scan chains having odd number of flip-flop cells and a second input trigger signal inverted to the first input trigger signal for scan chains having even number of flip-flop cells.

7. The integrated circuit of claim 1, wherein the first logic gate comprises an AND gate.

8. The integrated circuit of claim 1, wherein the master latch receives the first data signal and generates the first latch signal in a second half of each clock cycle, and the slave latch receives the first latch signal and generates the second latch signal in a first half of a next clock cycle.

9. A method for performing a scan test on an integrated circuit (IC) operable in a scan mode, wherein the IC includes at least one scan chain formed by a plurality of cascaded flip-flop cells, wherein the plurality of flip-flop cells include at least a first flip-flop cell for receiving a scan input signal, and a last flip-flop cell for outputting a scan output signal, and wherein each flip-flop cell includes a master latch and a slave latch connected in series, the method comprising:
  providing a clock signal to the plurality of flip-flop cells;
  providing the scan input signal to the scan chain through a scan data input terminal of the first flip-flop cell based on the clock signal;
  starting from the last flip-flop cell of the scan chain, configuring every N flip-flop cells as a subset, wherein N is a natural number greater than 1;
  selecting a selected flip-flop cell from each subset in each clock cycle of the clock signal;
  disabling and bypassing the slave latches of non-selected flip-flop cells in the scan chain;
  shifting the scan input signal to the selected flip-flop cell;
  outputting data in the slave latch of the selected flip-flop cell in a first subset that includes the last flip-flop cell as the scan output signal of the scan chain, wherein the N flip-flop cells in each subset are selected successively from the last flip-flop cell in the subset in a round robin manner; and
  bypassing the master latches of the non-selected flip-flop cells in the at least one scan chain, such that the scan input signal received at the scan data input terminal of each of the non-selected flip-flop cells is directly output from a scan data output terminal of each of the non-selected flip-flop cells.

10. The method of claim 9, wherein the IC comprises a plurality of the scan chains that form an array of the flip-flop cells, wherein the array comprises a plurality of columns of the flip-flop cells including at least a first column formed by the first flip-flop cells of the scan chains, and a last column formed by the last flip-flop cells of the scan chains, wherein in the scan mode, the method further comprising:
  starting from the last column of the array, configuring every N column as a subset;
  selecting a selected column of flip-flop cells from each subset in each clock cycle of the clock signal; and
  disabling and bypassing the slave latches of the flip-flop cells in non-selected columns in the array,
  wherein at least part of the columns of flip flop cells are selected by a trigger signal provided by a previous column of flip-flop cells respectively thereof.

11. The method of claim 10, wherein the columns in each subset are selected successively from the last column in the subset in a round-robin manner.

12. The method of claim 9, wherein at least some of the flip-flop cells are selected by a trigger signal provided by a previous flip-flop cell respectively thereof.

13. The method of claim 9, further comprising reading the scan output signal to verify functionality of the IC.

14. The method of claim 9, wherein the plurality of cascaded flip-flop cells are operable between the scan mode and a functional mode based on a scan enable signal, the method further comprising:
  setting the scan enable signal at a first logic state to configure the plurality of flip-flop cells in the scan mode.

15. The method of claim 9, wherein the master latch of each of the flip-flop cells receives a scan data input signal and generates a first latch signal in a second half of each clock cycle, and the slave latch of the selected flip-flop cell receives the first latch signal and generates a second latch signal in a first half of a next clock cycle.

16. The method of claim 15, wherein in each clock cycle of the clock signal, each of the slave latches of the non-selected flip-flop cells in the at least one scan chain holds the second latch signal.

17. The method of claim 9, wherein disabling and bypassing the slave latches of non-selected flip-flop cells in the at least one scan chain comprises gating the clock signal provided to the slave latches of the non-selected flip-flop cells.

* * * * *